(12) United States Patent
Haga et al.

(10) Patent No.: US 6,243,317 B1
(45) Date of Patent: Jun. 5, 2001

(54) SEMICONDUCTOR MEMORY DEVICE WHICH ACTIVATES COLUMN LINES AT HIGH SPEED

(75) Inventors: Ryo Haga, Yokohama; Toshimasa Namekawa, Tokyo, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/404,791

(22) Filed: Sep. 24, 1999

(30) Foreign Application Priority Data

Oct. 14, 1998 (JP) .................................................. 10-292152

(51) Int. Cl.[7] ...................................................... G11C 8/00
(52) U.S. Cl. ................................ 365/230.06; 365/189.05; 365/189.11
(58) Field of Search ..................... 365/230.06, 189.05, 365/189.11, 194

(56) References Cited

U.S. PATENT DOCUMENTS

| 5,796,657 | * | 8/1998 | Lee et al. | 365/230.06 |
| 6,034,913 | * | 3/2000 | Freimijth | 365/230.06 |
| 6,034,914 | * | 3/2000 | Inaba et al. | 365/230.06 |
| 6,049,503 | * | 4/2000 | Khang | 365/230.06 |

FOREIGN PATENT DOCUMENTS

| 55-117788 | 9/1980 | (JP) . |
| 55-117787 | 10/1980 | (JP) . |
| 56-148788 | 11/1981 | (JP) . |
| 60/113396 | 6/1985 | (JP) . |
| 62-149096 | 7/1987 | (JP) . |
| 62-149097 | 7/1987 | (JP) . |
| 63-188892 | 8/1988 | (JP) . |
| 63-191396 | 8/1988 | (JP) . |
| 4-370595 | 12/1992 | (JP) . |
| 8-287678 | 11/1996 | (JP) . |
| 11-017137 | 1/1999 | (JP) . |

OTHER PUBLICATIONS

ISSCC98 / Session 5 / DRAM / Paper TP 5.1 "A Configurable DRAM Macro Design for 2112 Derivative Organizations to be Synthesized Using a Memory Generator", Y. Yabe et al., IEEE International Solid-State Circuits Conference, 1998.

* cited by examiner

Primary Examiner—Son T. Dinh
(74) Attorney, Agent, or Firm—Banner & Witcoff, Ltd.

(57) ABSTRACT

Column select lines for selecting a column in a memory cell array are provided near the memory cell array. Main column select sections including drivers are connected to one end of the column select lines. Latch circuits are connected to the other end of the column select lines. Receiving the output signal from the driver, the latch circuit, together with the driver, drives the column select line.

22 Claims, 12 Drawing Sheets

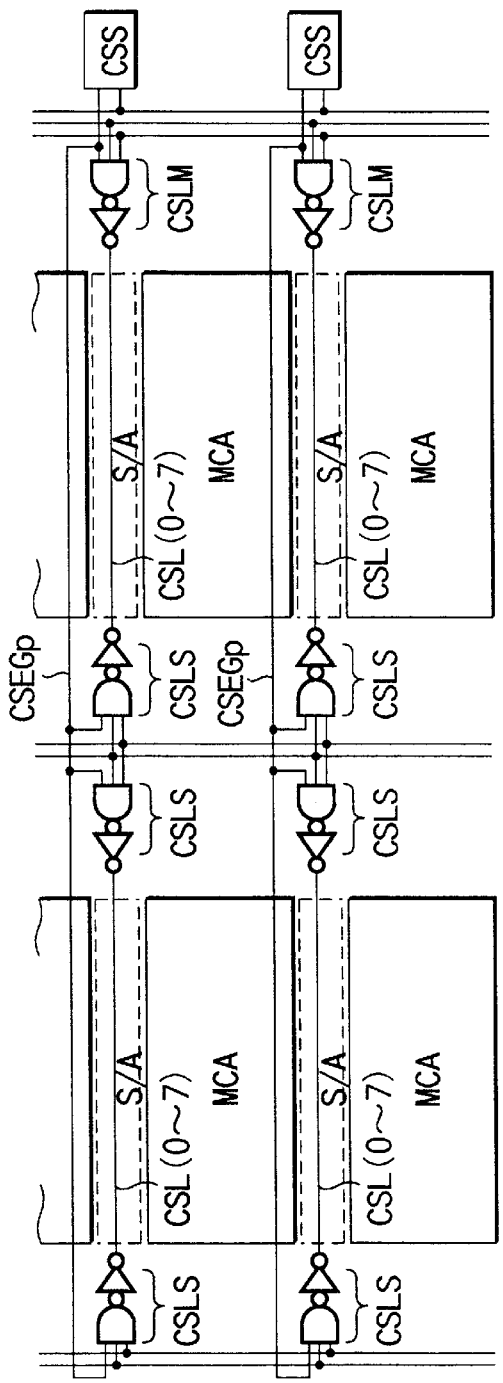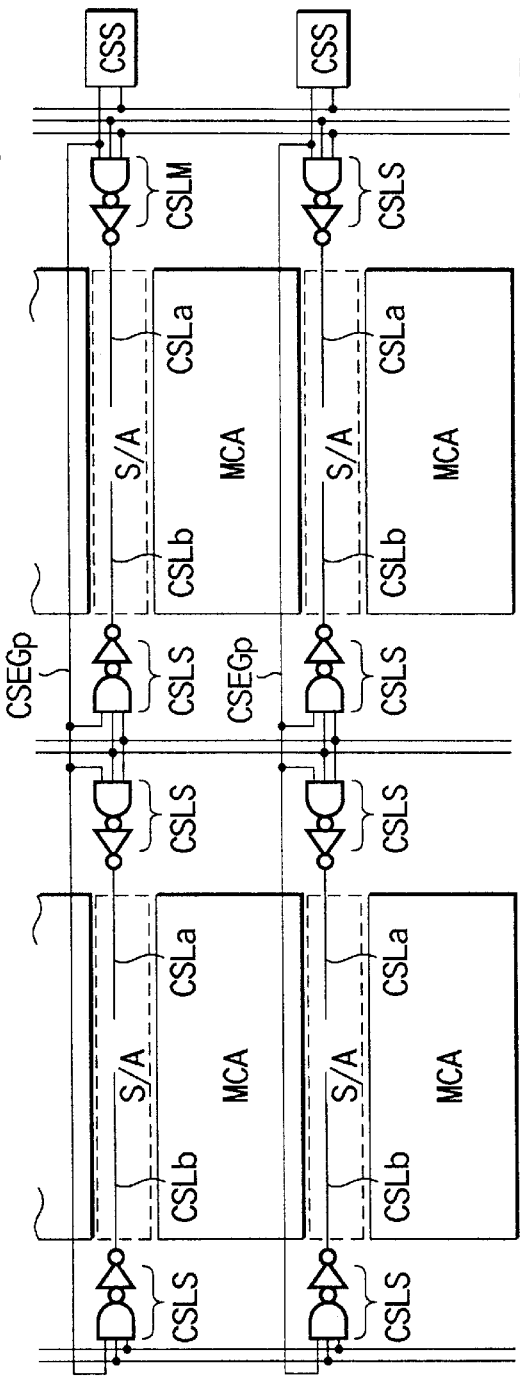

US 6,243,317 B1

SEMICONDUCTOR MEMORY DEVICE WHICH ACTIVATES COLUMN LINES AT HIGH SPEED

BACKGROUND OF THE INVENTION

This invention relates to a semiconductor memory device, such as a DRAM (dynamic random access memory), and more particularly to the activation of column select lines.

FIG. 17 schematically shows the configuration of an ordinary DRAM. The DRAM comprises memory cell arrays (MCA) 171a, 171b, row decoders (RDC) 171c, 171d, row segment selectors (RSS) 171e, 171f, column decoders (CDC) 171g, 171h, 171i, column segment selectors (CSS) 171j, 171k, 171l, a column address buffer (CAB) 171m to which a column address is inputted, a row address buffer (RAB) 171n to which a row address is inputted, a row command buffer (RCB) 171o to which a row-system command is inputted, a column command buffer (CCB) 171p to which a column-system command is inputted, and sense amplifier areas (S/A) 171q, 171r, 171s in which sense amplifiers are placed. On the memory cell arrays 171a, 171b, data line pairs DQ, /DQ (/ denotes an inverted signal) are provided. These data line pairs DQ, /DQ are connected to bit lines via column select gates, which will be explained later.

The memory cell arrays 171a, 171b include memory cells MC, word lines WL for selecting the memory cells, and bit lines BL. On both sides of each of the memory cell arrays 171a, 171b, the sense amplifier areas 171q, 171r, 171s are provided. When more than one row of memory cell arrays exists, a group of memory cell arrays set in the same row is called a row segment and a group of memory cell arrays set in the same column is called a column segment.

The row segment selectors 171e, 171f select a row segment according to a row address. The row decoders 171c, 171d select a word line in the memory cell arrays in the row segment selected by the row segment selectors 171e, 171f. The column segment selectors 171j, 171k, 171l select a column segment in the selected row segment according to a column address and the output signals of the row segment selectors 171e, 171f. The column decoders 171g, 171h, 171i select a column select line CSL in the column segment selected according to the column address and a row address. The selected column select line CSL drives a column select gate (not shown), thereby selecting a bit line BL.

When data is inputted to or outputted from the memory cell arrays 171a, 171b, the row command buffer 171o inputs a command to activate a word line and a row address is inputted to the row address buffer 171n. Part of the row address selects one or more of the row segments and the remaining row address selects one word line in the selected row segment.

For example, as shown in FIG. 18, the DRAM is assumed to have four memory cell arrays MCA0 to MCA3. It is assumed that each memory cell has 512 word lines and two memory cell arrays are activated simultaneously. Eight CSL (column select lines) (not shown) are assumed to be on each sense amplifier area S/A. Row addresses R0 to R8 determine which word line in the row segment should be activated and row address R9 determines which of the consecutive memory cell arrays should be activated. Because there are four memory cell arrays in the example, word lines in the two memory cell arrays MCA0 and MCA2 are activated as shown by solid lines. As a result, the data in the memory cells connected to the activated word lines are read by the sense amplifiers.

To access the data read by the sense amplifiers, a read command is supplied to the column command buffer 171p and a column address is supplied to the column address buffer 171m. The column address determines which sense amplifier should supply the data to the data line pair DQ, /DQ.

Recently, a logic-incorporated memory where a logic circuit has been incorporated into a memory core chip has been developed. Since in the logic-incorporated memory, a large amount of data is transferred between the memory section and logic section, a large I/O width (bit width) is needed. As a result, the number of data lines connected to the input/output terminals is also very large, leading to a large number of column select gates connected to a single column select line CSL. Such a memory often employs an overlaid DQ system in which the data lines are placed above each memory cell array.

FIG. 19 shows an example of the overlaid DQ system. In the overlaid DQ system, many column select gates CSG are connected to a single column select line CSL. As a result, the gate capacitance included in the column decoder and connected to a single driver DRV for driving the column select line becomes very great. The capacitance increases a delay in the transfer of the signal. Consequently, as the signal transmitting over the column select line goes further away from the driver DRV, its waveform becomes duller, which makes a high-speed operation more difficult.

To prevent this, the configuration of FIG. 20 has been considered. In the configuration, blocks of the same construction composed of, for example, a column segment selector CSS, a column decoder CDC, and a driver DRV are placed on both sides of the memory cell arrays MCA. The column select line CSL is driven on both sides. In this case, however, blocks of the same construction have to be placed on both sides of the memory cell arrays. In the case of a complex logic column segment selector CSS, the size of its circuit is large. Consequently, the layout of the blocks requires very large areas, which causes the problem of making the layout size greater.

BRIEF SUMMARY OF THE INVENTION

It is, accordingly, an object of the present invention to overcome the above disadvantages by providing a semiconductor memory device capable of not only activating the column select lines reliably at high speed but also preventing the layout size from increasing.

The foregoing object is accomplished by providing a semiconductor memory device comprising: a memory cell array with memory cells arranged in the directions of row and column in matrix form; column select gates for selecting columns in the memory cell array; column select lines which are connected to the column select gages and transmit activating signals for activating column select gates; column decoders which are connected to one end of the column select lines and produce the activating signals according to an address; and driving circuits which are connected to the other end of the column select lines and which receive the activating signals supplied via the column select lines from the column decoders and drive the column select lines.

With the present invention, the column decoders are connected to one end of the column select lines and the driving circuits are connected to the other end of the column select lines. The column select lines are driven by the column decoders and driving circuits. This prevents the signal transmitted over the column select lines from becoming dull and therefore enables a high-speed operation. In addition, the driving circuits are simple in construction, which prevents the layout area from increasing.

Furthermore, the foregoing object is accomplished by providing a semiconductor memory device comprising: memory cell arrays with memory cells arranged in the directions of row and column in matrix form; column select gates which are provided near the memory cell arrays and select columns in the memory cell arrays; column select lines which are connected to the column select gates and transmit activating signals for activating column select gates; a select signal generator circuit which is provided on the side of one end of the column select lines and generates a select signal for selecting the memory cell array according to an address; a first decoder which is connected to one end of the column select lines and generates the activating signals according to an address and the select signal supplied from the select signal generator circuit; and a second decoder which is connected to the other end of the column select lines and, together with the first decoder, generates the activating signals according to the address and the select signal supplied from the select signal generator circuit.

With the present invention, the first decoder is provided at one end of the column select lines and the second decoder is provided at the other end of the column select lines. The column select lines are driven by the first and second decoders. This prevents the signal transmitted over the column select lines from becoming dull and therefore enables a high-speed operation.

Furthermore, first and second column select lines are provided straight in the direction of row in the memory cell. The first decoder for producing an activating signal is connected to the first column select lines. The second decoder for, together with the first decoder, producing the activating signal is connected to the second column select lines. This enables the first and second column select lines to be driven at high speed.

Moreover, the first and second column select lines are provided on each of the first and second memory cell arrays. The first and second decoders are connected to both ends of the first column select lines. The second decoder is connected to both ends of the second column select lines. This configuration enables the first and second column select lines to be driven at high speeds.

Additionally, the first and second column select lines are provided on each of the first and second memory cell arrays. The first decoder is connected to one end of the first column select lines. The second decoder which operates together with the first decoder is connected to one end of the second column select lines. This configuration enables the first and second column select lines to be driven at high speeds.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below serve to explain the principles of the invention.

FIG. 14 is a circuit diagram of part of the circuit of FIG 13;

FIG. 15 is a circuit diagram of the circuit obtained by applying the fifth embodiment to the third embodiment;

DETAILED DESCRIPTION OF THE INVENTION

Hereinafter, referring to the accompanying drawings, embodiments of the present invention will be explained.

Figure 1:
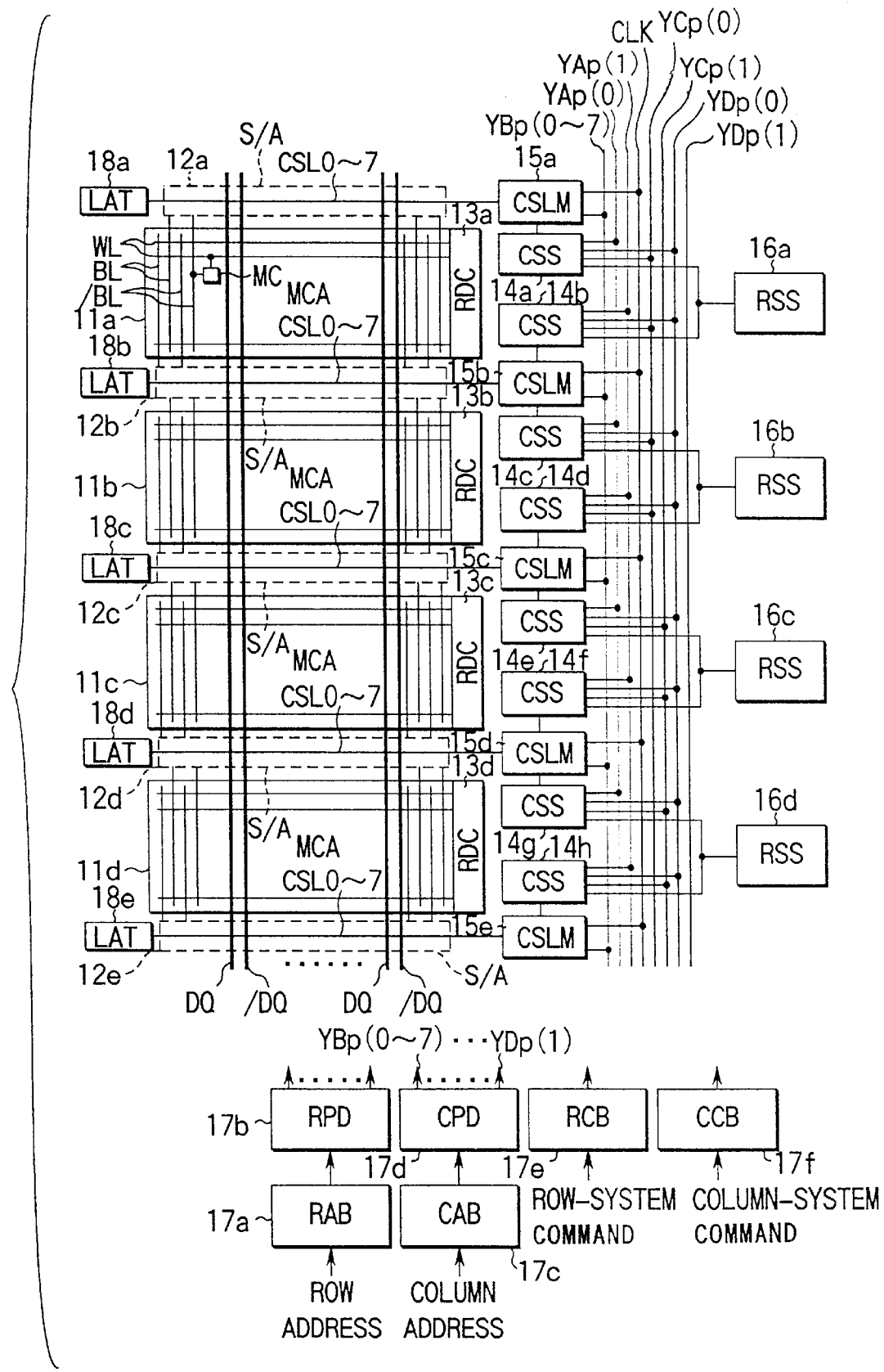
FIG. 1 is a schematic block diagram of the main part of a semiconductor memory device according to a first embodiment of the present invention.
Figure 19:
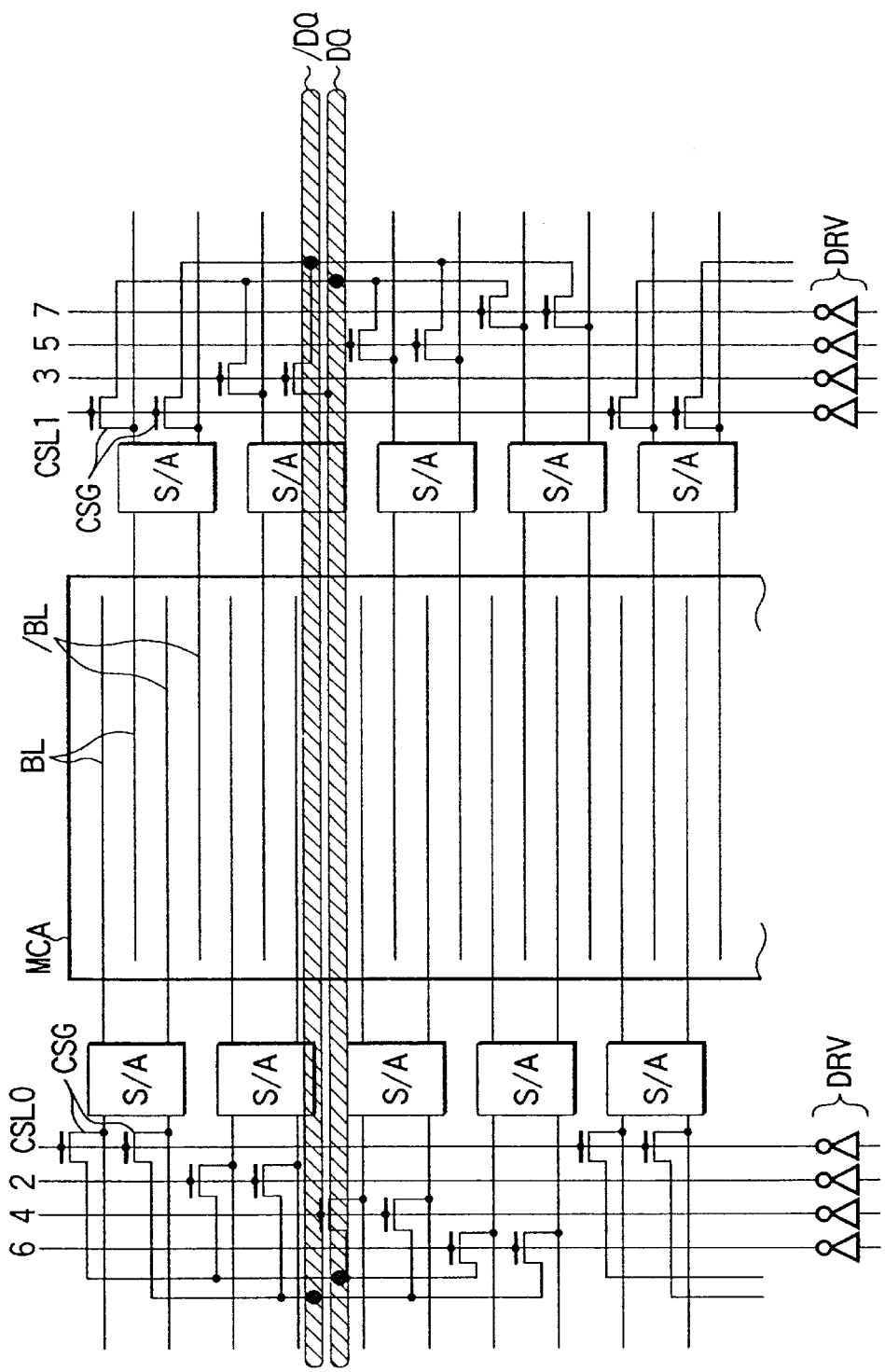
FIG. 19 a circuit diagram of the overlaid DQ system.
Figure 20:
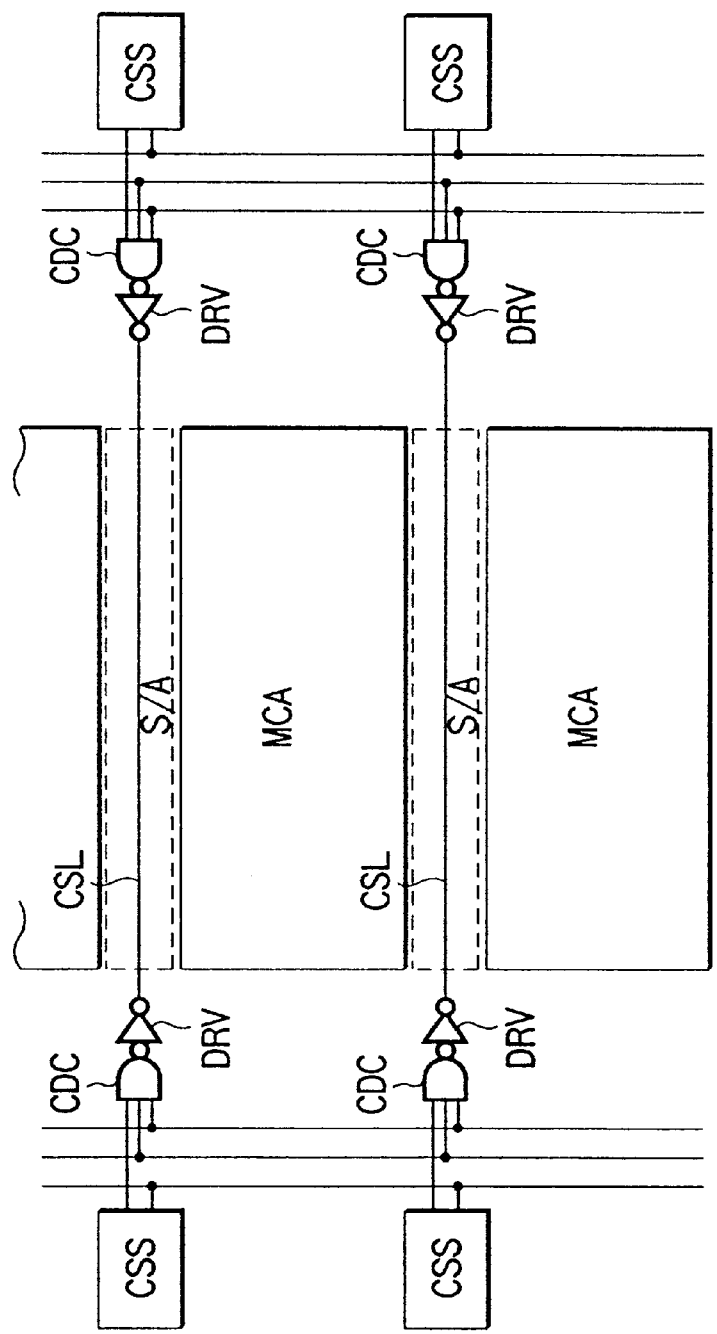
FIG. 20 is a circuit diagram of a conventional column select circuit.

FIG. 1 schematically shows the main part of a DRAM according to a first embodiment of the present invention. In the DRAM, memory cell arrays (MCA) 11a, 11b, 11c, 11d have memory cells MC, word lines WL for selecting the memory cells, and bit lines BL, /BL. The number of memory cell arrays is not limited to the above value. A row segment can include more than one memory cell array. On both sides of each of the memory cell arrays 11a to 11d, sense amplifier areas (S/A) 12a, 12b, 12c, 12d, 12e are provided. Each of the sense amplifier areas 12a to 12e has sense amplifiers (not shown). Each sense amplifier is connected to a bit line pair of the adjacent memory cell array. Row decoders (RDC) 13a, 13b, 13c, 13d are provided for the memory cell arrays 11a to 11d, respectively. The row decoders 13a to 13d select a word line WL according to a row address. On each of the memory cell arrays 11a to 11d, data line pairs DQ, /DQ for outputting the data are provided. The data line pairs DQ, /DQ are connected to the bit line pairs via column select gates (not shown) adjacent to the sense amplifier areas (S/A) 12a to 12e. The configuration of the column select gate is almost the same as that of FIG. 19.

Near each of the memory cell arrays 11a to 11d, there are provided column segment selectors (CSS) 14a to 14h, main column select sections (CSLM) 15a to 15e, and row segment selectors (RSS) 16a to 16d.

Additionally, near the memory cell arrays, there are provided a row address buffer (RAB) 17a to which a row address is inputted, a row predecoder (RPD) 17b that is connected to the row address buffer 17a and predecodes a row address, a column address buffer (CAB) 17c to which a column address is inputted, a column predecoder (CPD) 17d that is connected to the column address buffer 17c and predecodes a column address, a row command buffer (RCB) 17e to which a row-system command is inputted, and a column command buffer (CCB) 17f to which a column-system command is inputted. The column predecoder 17d predecodes a column address and outputs column addresses YBp(0 to 7), YAp(0), YAp(1), Ycp(0), YCp(1), YDp(0), and YDp(1).

The main column select section 15a is connected to the column segment selector 14a, and the main column select section 15b is connected to the column segment selectors 14b, 14c. The main column select section 15c is connected to the column segment selectors 14d, 14e, and the main column select section 15d is connected to the column segment selectors 14f, 14g. The main column select section 15e is connected to the column segment selector 14h. These column segment selectors 14a to 14h and main column select sections 15a to 15e are connected to the column predecoder 17d and column command buffer 17f.

The column segment selectors 14a, 14b are connected to the row segment selector 16a; the column segment selectors 14c, 14d are connected to the row segment selector 16b; the column segment selectors 14e, 14f are connected to the row segment selector 16c; and the column segment selectors 14g, 14h are connected to the row segment selector 16d.

Figure 17:
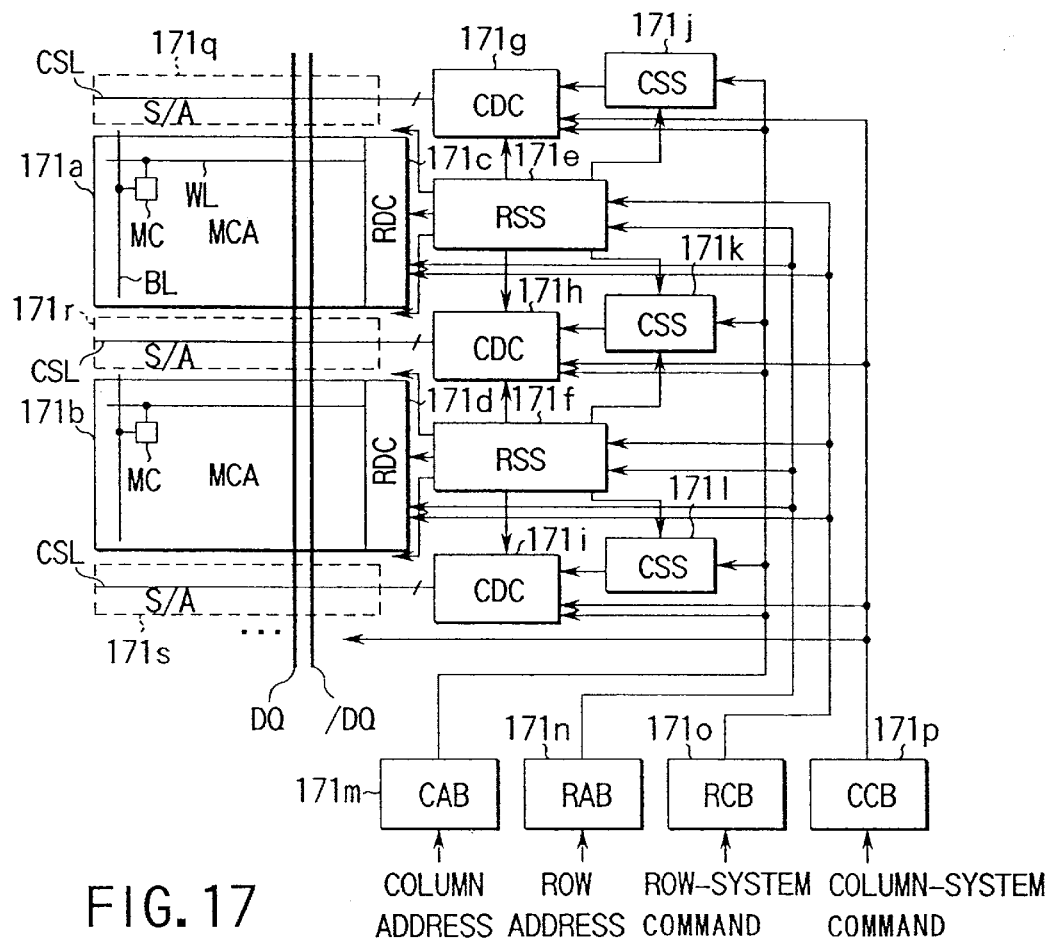
FIG. 17 shows the configuration of an ordinary DRAM.
Figure 18:
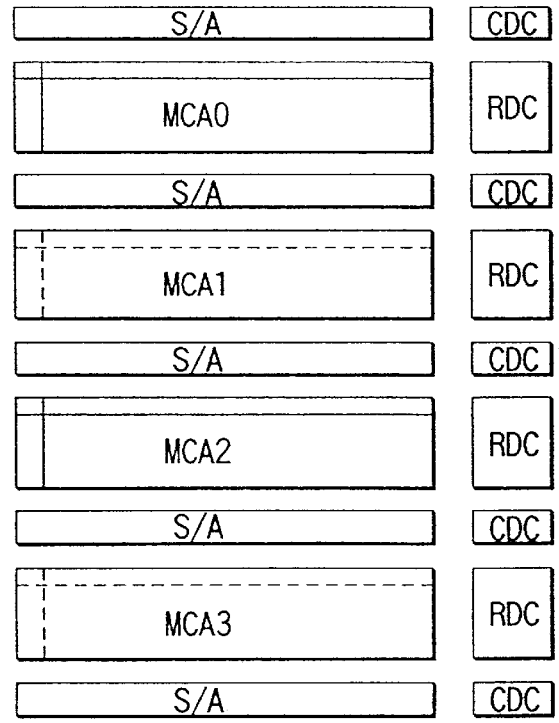
FIG. 18 shows the configuration of the cell array of an ordinary DRAM.

Each of the row segment selectors 16a to 16d has the same configuration as that of the row segment selector shown in FIG. 17. The row segment selectors 16a to 16d select more than one row segment according to the row address supplied from the row predecoder 17b. The row decoders in the selected row segments select word lines in the memory cell array. The column segment selectors 14a to 14h select a column segment in the selected row segments according to a row address and the output signals from the row segment selectors 16a to 16d.

Figure 2:
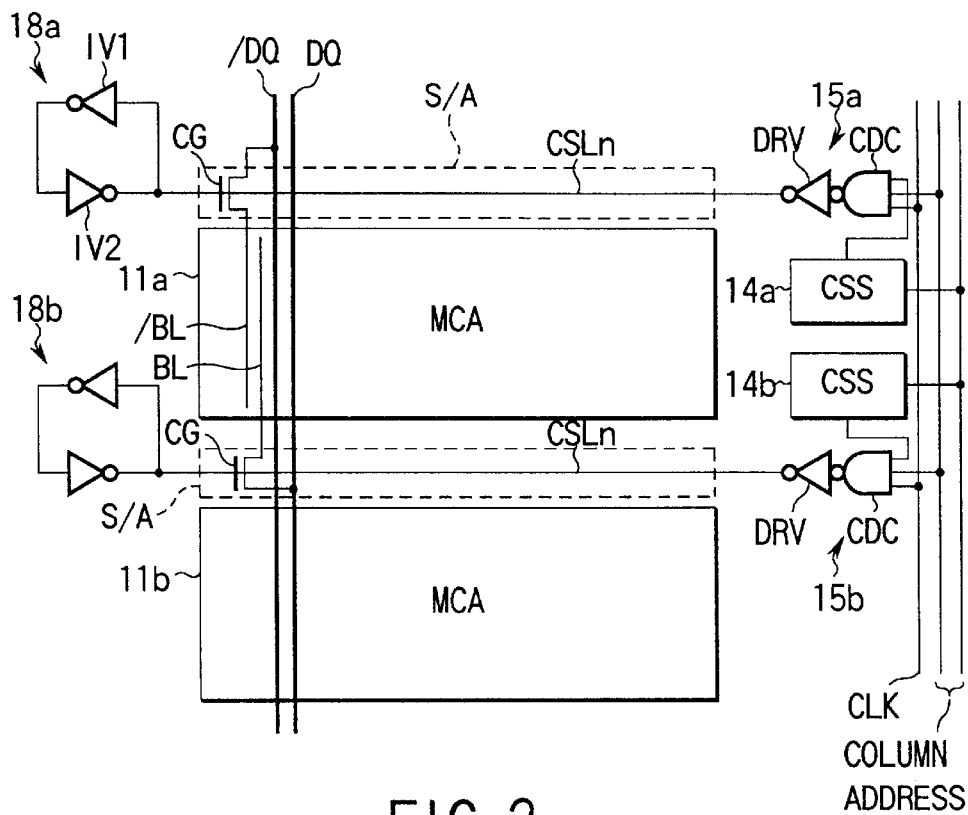
FIG. 2 is a schematic block diagram of the column select section of FIG. 1.

FIG. 2 schematically shows the configuration of the main column select sections 15a to 15e. In FIG. 2, only the main column select sections 15a and 15b are shown. Each of the main column select sections 15a 15b is composed of a column decoder CDC and a driver DRV. The column decoder CDC selects one of the column select lines CSL according to a column address and clock signal CLK. The driver DRV activates the selected column select line CSL. The activated column select line drives a column select gate CsG. Through the column select gate CSG, a bit line pair BL, /BL is connected to a data line pair DQ, /DQ.

As shown in FIG. 1, the main column select sections 15a to 15e are connected to one end of the column select lines CSL 0 to 7. The column select lines CSL are provided along the memory cell arrays. The latch circuits (LAT) 18a to 18e are connected to the other end of the column select lines CSLs. Each of the latch circuits 18a to 18e is composed of two inverter circuits IV1 and IV2 as shown in FIG. 2. When the column select line CSLn is activated, the latch circuits 18a to 18e latch the state and drive the column select line CSLn, starting at the other end of the column select line CSLn.

Figure 3:
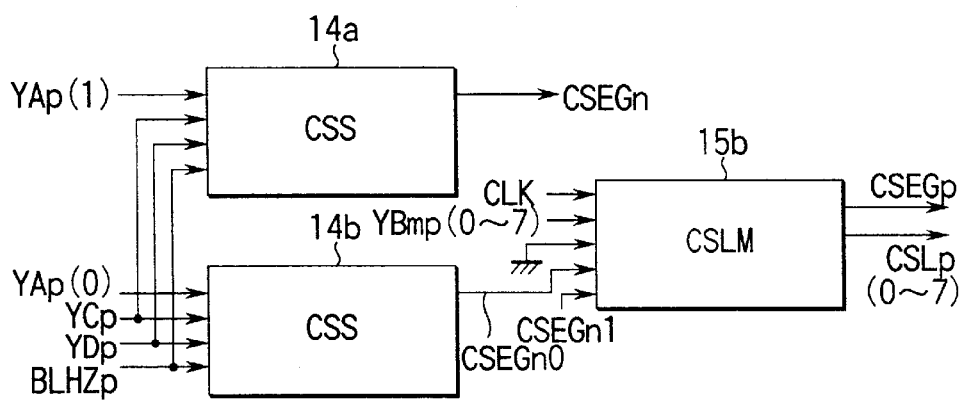
FIG. 3 a schematic block diagram of the column select section of FIG. 1.
Figure 4:
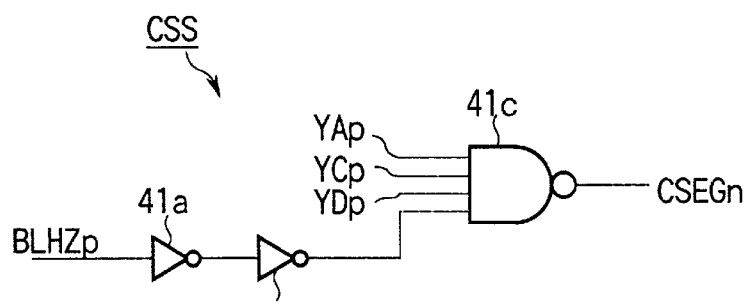
FIG. 4 is a circuit diagram of an example of the column segment selector (CSS) of FIG. 3.

FIG. 3 shows the configuration of the column segment selector (CSS) and main column select section (CSLM). FIG. 4 is a circuit diagram of the column segment selector (CSS).

AS shown in FIG. 4, the column segment selector (CSS) is composed of inverter circuits 41a, 41b and a NAND circuit 41c connected in series. A memory cell select signal BLHZp is a signal for informing the column-system circuit that the sense amplifier has been activated. The memory cell select signal BLHZp is supplied to the NAND circuit 41c via the inverter circuits 41a, 41b. Part of the predecoded column address, YCp, YDp, and the least-significant bit YAp(0) in the predecoded column address are supplied to the NAND circuit 41c. According to these signals, a column decoder select signal CSEGn is produced. The column decoder select signal CSEGn is supplied to the column decoder constituting the main column select section CSLM.

Figure 5:
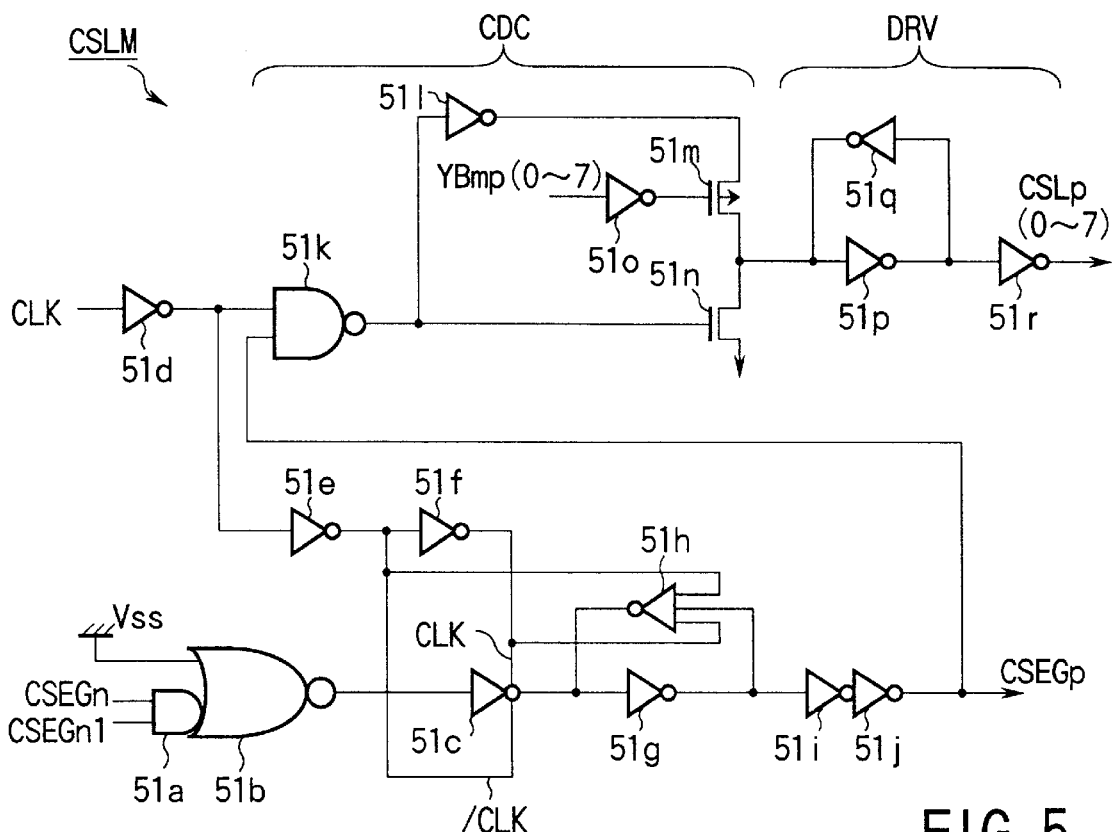
FIG. 5 is a circuit diagram of an example of the column select section (CSLM) of FIG. 3.

FIG. 5 is a circuit diagram of the main column select section (CSLM). The column decoder select signal CSEGn outputted from the column segment selector (CSS), together with the column decoder select signal CSEGn1 outputted from the adjacent column segment selector (CSS), is supplied to an AND circuit 51a. The output signal of the AND circuit 51a, together with a ground potential Vss, is supplied to a NOR circuit 51b. The output terminal of the NOR circuit 51b is connected to the input terminal of a clocked inverter circuit 51c. The clocked inverter circuit 51c is controlled by clock signals CLK, /CLK supplied via inverter circuits 51d, 51e, 51f. The output terminal of the clocked inverter circuit 51c is connected to the input terminal of an inverter circuit 51g and the output terminal of a clocked inverter circuit 51h.

The output terminal of the inverter circuit 51g is connected to the input terminal of the clocked inverter circuit 51h. The clocked inverter circuit 51h is controlled by the clock signals CLK, /CLK supplied from the inverter circuits 51f, 51e. The clocked inverter circuits 51c, 51h, and inverter circuit 51g constitute a latch circuit controlled by the clock signal. The output terminal of the inverter circuit 51g is connected to the input terminal of an inverter circuit 51i. The output terminal of the inverter circuit 51i is connected to the input terminal of an inverter circuit 51j. The inverter circuit 51j output a segment select signal CSEGp at its output terminal.

The clock signal outputted from the output terminal of the inverter circuit 51d, together with the segment select signal CSEGP supplied from the output terminal of the inverter circuit 51j, is supplied to a NAND circuit 51k constituting a column decoder CDC. The output terminal of the NAND circuit 51k is connected to the source of a p-channel transistor 51m via an inverter circuit 51l. The drain of the p-channel transistor 51m is grounded via an n-channel transistor 51n. The gate of the n-channel transistor 51n is connected to the output terminal of the NAND circuit 51k via an inverter circuit 51o. All the remaining signals YBmp (0 to 7) in the column address are supplied to the gate of the p-channel transistor 51m. A decode signal for selecting a single column line is outputted at the connection node of the p-channel transistor 51m and n-channel transistor 51n. The connection node is connected to the input terminal of an inverter circuit 51p constituting a driver DRV and the output terminal of an inverter circuit 51q. The input terminal of the inverter circuit 51q is connected to the output terminal of the inverter circuit 51p. The output terminal of the inverter circuit 51p is connected to the input terminal of an inverter circuit 51r. A column select signal CSLp (0 to 7) is outputted at the output terminal of the inverter circuit 51r.

Figure 6:
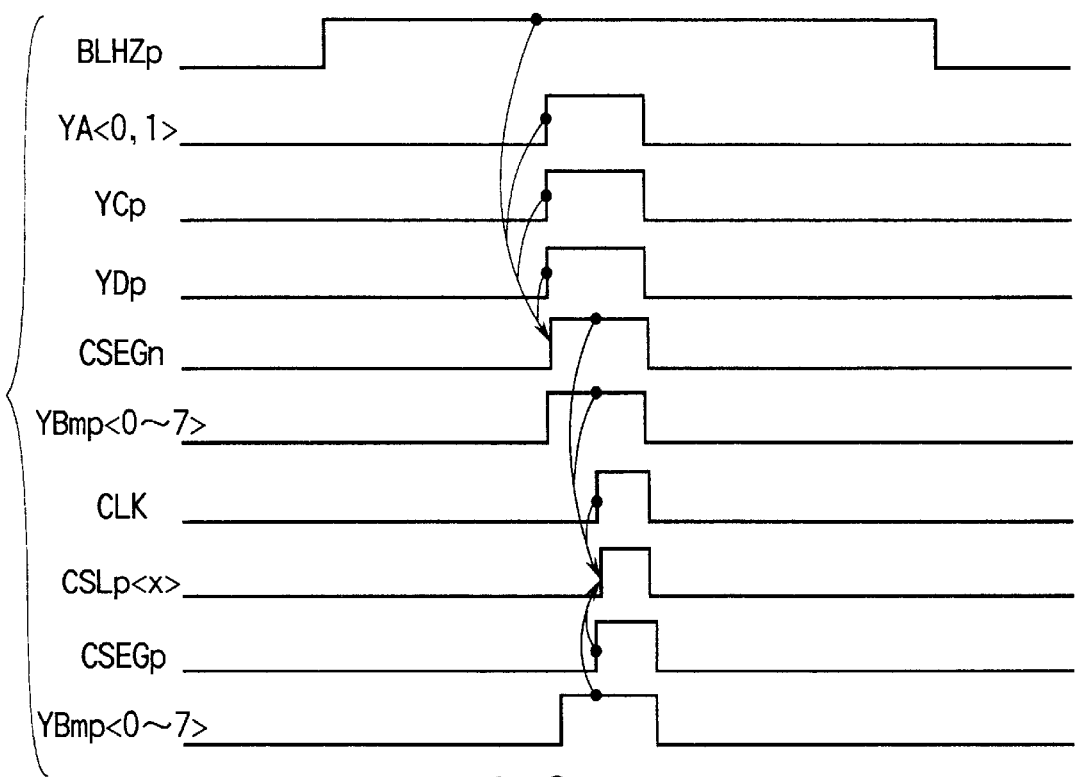
FIG. 6 is a timing chart to help explain the operation of circuit of FIGS. 4 and 5.

FIG. 6 is a timing chart to help explain the operation of the column segment selector (CSS) and column select section (CSLM). The column segment selector (CSS) and column select section (CSLM) operate according to the timing chart.

With the first embodiment, when a column select line CSL is activated according to the column select signal CSLp (0 to 7) outputted from the drivers DRV of the main column select sections 15a to 15e, the latch circuits 18a to 18e operate, which allows the inverter circuits IV2 constituting the latch circuits 18a to 18e to drive the column select line CSL. As a result, the column select line CSL is driven on both sides, preventing the signal from becoming dull on the column select line CSL at parts away from the column decoder CDC and driver DRV, which enables a high-speed operation. This is particularly effective in a case where many column select gates are connected to the column select lines and a large parasitic capacitance is connected to the column select lines as in the logic-merged memory.

Since each of the latch circuits 18a to 18e is a simple circuit composed of two inverter circuits Iv1 and IV2, the pattern area is smaller and therefore the chip occupies a smaller area. Consequently, the layout size can be reduced remarkably as compared with a conventional circuit where column segment selectors with complex logic were placed on both sides of each memory cell array.

Next, a second embodiment of the present invention will be explained. In the first embodiment, the drivers DRV are placed at one end of the memory cell arrays and the latch circuits 18a to 18e are placed at the other end of the memory cell arrays. The latch circuits 18a to 18e are driven by the column select signal CSLp itself transferred over the column select line CSL. As a result, it takes a long time for the signal to be transmitted to the inverter IV2 after the driver DRV starts to operate. In the meantime, a through current can flow between the inverter circuit 51r constituting the driver DRV and the inverter circuit IV2 constituting the latch circuit. In addition, the size of the inverter circuits IV1, IV2 constituting the latch circuits 18a to 18e must be made smaller than the inverter circuits 15r constituting the drivers DRV to the extent that the latching is substantially effected, which prevents the driving power from being greater.

Figure 7:
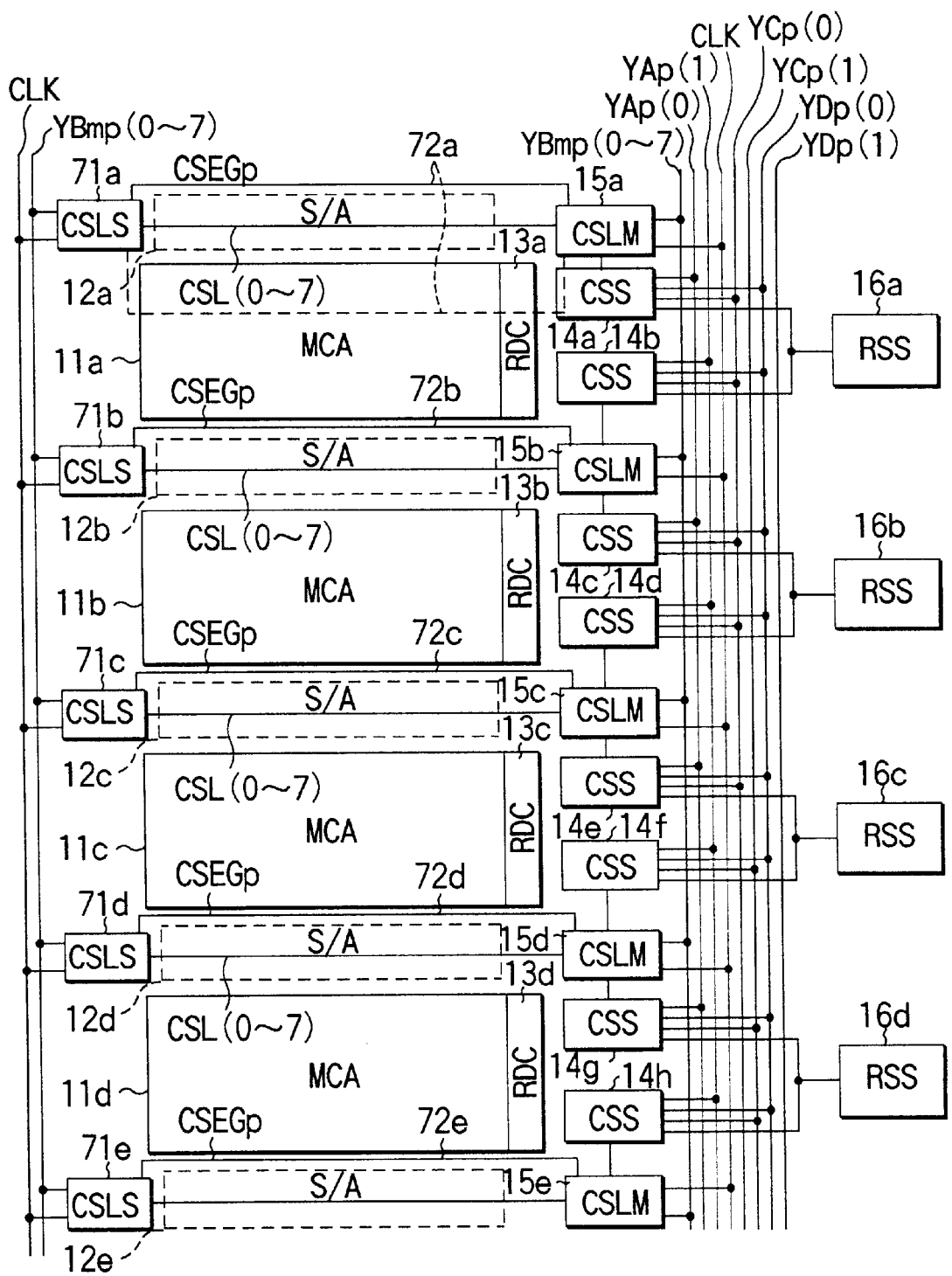
FIG. 7 a schematic block diagram of the main part of a semiconductor memory device according to a second embodiment of the present invention.

FIG. 7 shows a second embodiment of the present invention. In FIG. 7, the same parts as those in the first embodiment are indicated by the same reference symbols. Only the parts different from those in the first embodiment will be explained.

In the second embodiment, main column select sections are provided at one end of the column select lines and sub-column select sections are provided at the other end of the column select lines. The main column select sections and sub-column select sections are driven simultaneously, thereby activating column select lines CSL. Specifically, the main column select sections (CSLM) 15a to 15e are provided at one end of the memory cell arrays 11a to 11d and the sub-column select sections (CSLS) 71a to 71e are provided at the other end of the memory cell arrays. To the sub-column select sections (CSLS) 71a to 71e, a column address YBmp (0 to 7) for selecting a column select line and a clock signal CLK for determining the timing are supplied. The main column select sections (CSLM) 15a to 15e generate a segment select signal CSEGp for determining a column select line driver and supply the segment select signal CSEGp to the sub-column select sections 71a to 71e. The segment select signal CSEGp is outputted at the output terminal of the inverter circuit 51j shown in FIG. 5. Wires 72a to 72e for transmitting the segment select signals CSEGP outputted from the main column select sections 15a to 15e to the sub-column select sections 71a to 71e are provided, for example, above the sense amplifier areas 12a to 12e as shown by solid lines in FIG. 7. Alternatively, as shown by broken lines in FIG. 7, the wires are provided above the memory cell arrays 11a to 11e (FIG. 7 shows only a wire 72a provided above the memory cell array 11a).

Figure 8:
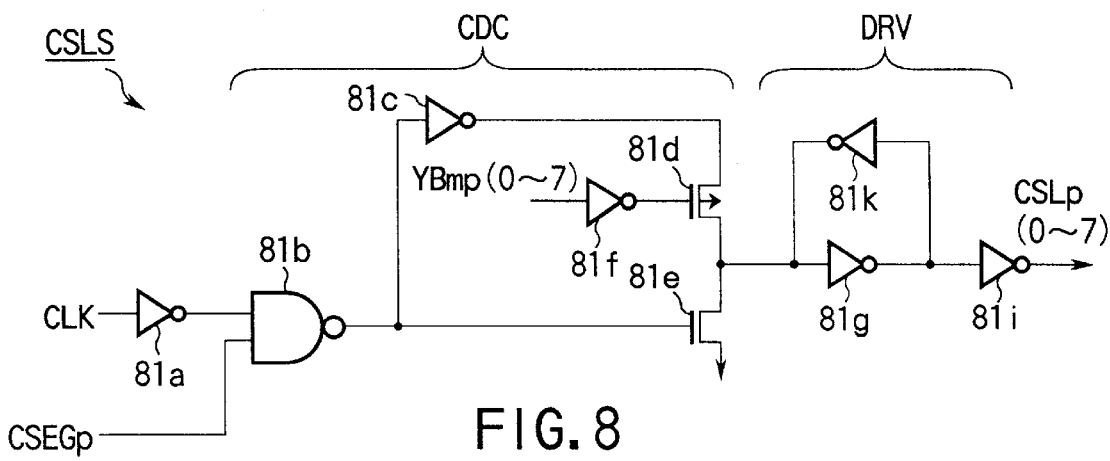
FIG. 8 is a circuit diagram of an example of the column select section (CSLM) of FIG. 7.

FIG. 8 is a circuit diagram of the sub-column select sections (CSLS) 71a to 71e. A clock signal CLK is supplied to the input terminal of an inverter circuit 81a. The inverted clock signal CLK from the output terminal of the inverter circuit 81a, together with the segment select signal CSEGP, is supplied to a NAND circuit 81b constituting a column decoder CDC. The output terminal of the NAND circuit 81b is connected to the source of a p-channel transistor 81d via an inverter circuit 81c. The drain of the p-channel transistor 81d is grounded via an n-channel transistor 81e. The gate of the n-channel transistor 81e is connected to the output terminal of the NAND circuit 81b. To the gate of the p-channel transistor 81d, all the signals YBmp (0 to 7) in the column address are supplied via an inverter circuit 81f. A decode signal is outputted at the connection node of the p-channel transistor 81d and n-channel transistor 81e. The connection node is connected to the input terminal of an inverter circuit 81g constituting a driver DRV and the output terminal of an inverter circuit 81k. The input terminal of the inverter circuit 81k is connected to the output terminal of the inverter circuit 81g. The output terminal of the inverter circuit 81g is connected to the input terminal of an inverter circuit 81i. A column select signal CSLp (0 to 7) is outputted at the output terminal of the inverter circuit 81i.

With the second embodiment, the main column select sections 15a to 15e for driving column select lines and the sub-column select sections 71a to 71e are provided on both sides of the column select lines. Using the segment select signal CSEGp supplied from the main column select sections 15a to 15e, the sub-column select sections 71a to 71e are driven simultaneously with the main column select sections 15a to 15e, thereby activating the column select line CSL. Accordingly, the operation speed in the second embodiment is faster than that in the first embodiment. Furthermore, the through current flowing between the drivers DRVs of the main column select sections and sub-column select sections provided on both sides of the column select lines is made smaller.

Moreover, the wires 72a to 72e for transmitting the segment select signals CSEGp are provided above the sense amplifier areas 12a to 12e or the memory cell arrays 11a to 11e. This makes it possible to connect the main column select sections 15a to 15e to the sub-column select sections 71a to 71e with the shortest distance between them, which suppresses a delay in the transmission of the signal.

Figure 9:
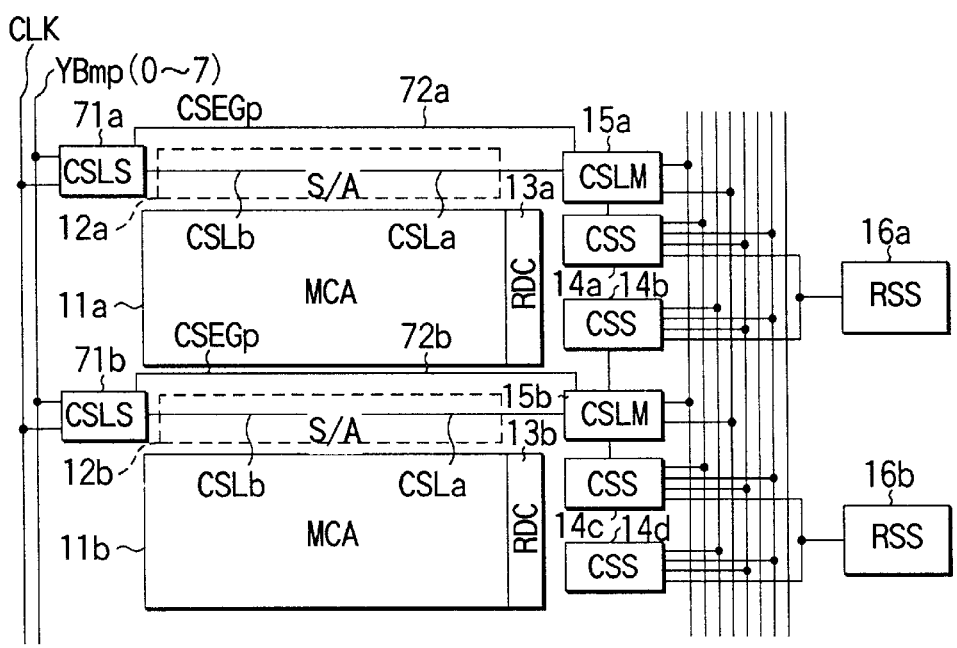
FIG. 9 is a schematic block diagram of the main part of a semiconductor memory device according to a third embodiment of the present invention.

FIG. 9 shows a third embodiment of the present invention. In FIG. 9, the same parts as those in FIG. 7 are indicated by the same reference symbols. In the third embodiment, the column select lines CSL in the second embodiment are divided in the middle into first column select lines CSLa and second column select lines CSLb. The first column select lines CSLa are driven by the main column select sections 15a to 15e and the second select lines CSLb are driven by the sub-column select sections 71a to 71e.

With the third embodiment, the division of the column select lines in two prevents a through current from flowing between the drivers of the main column select sections 15a to 15e and those of the sub-column select sections 71a to 71e. On top of that, the column select lines the main column select sections 15a to 15e and sub-column select sections 71a to 71e drive are short, leading to a decrease in the number of column select gates connected to the column select lines. This makes it possible to decrease the gate capacitance and step up the operation speed.

Figure 10:
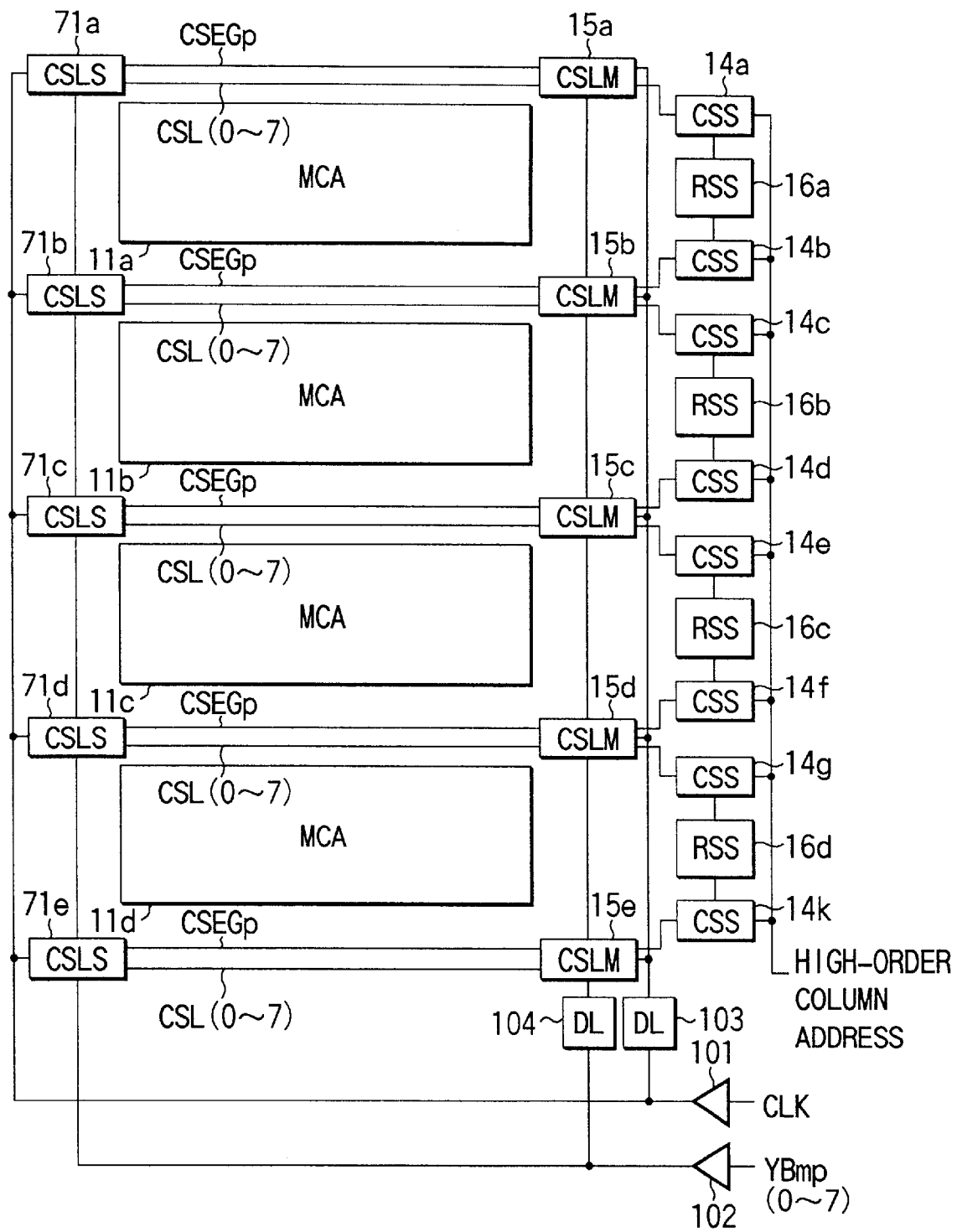
FIG. 10 is a schematic block diagram of the main part of a semiconductor memory device according to a fourth embodiment of the present invention.

FIG. 10 shows a fourth embodiment of the present invention. In FIG. 10, the same parts as those in the first to third embodiments are indicated by the same reference symbols. Only the parts different from those in the first to third embodiments will be explained. In the first to third embodiments, the clock signal CLK and column addresses YBmp (0 to 7) are inputted from, for example, the main column select section 15e side and supplied to the main column select sections 15a to 15e and sub-column select sections 71a to 71e. As a result, the signal reaches the sub-column select sections 71a to 71e later than the main column select sections 15a to 15e because the former have a longer transmission path than the latter. To overcome this drawback, the input timing of the clock signal CLK and column addresses YBmp (0 to 7) supplied to the main column select sections 15a to 15e is caused to coincide with that of the clock signal CLK and column addresses YBmp supplied to the sub-column select sections 71a to 71e.

Specifically, the clock signal CLK and column addresses YBmp (0 to 7) are supplied to the sub-column select sections (CSLS) 71a to 71e via buffers 101, 102. Delay circuits (DL) 103, 104 are connected to the output terminals of the buffers 101, 102. The clock signal CLK and column addresses YBmp (0 to 7) are supplied to the column select sections 15a to 15e via the delay circuits 103, 104. The delay circuits 103, 104 have delay times corresponding to the length from the output terminals of the buffers 101, 102 to the sub-column select sections 71a to 71e.

Figure 11:
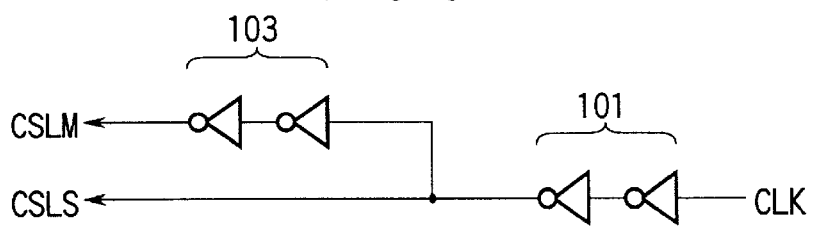
FIG. 11 is a circuit diagram of an example of the delay circuit of FIG. 10.

FIG. 11 shows the configuration of the buffer 101 and buffer 103. Each of the buffer 101 and delay circuit 103 is composed of two inverter circuits.

Figure 12:
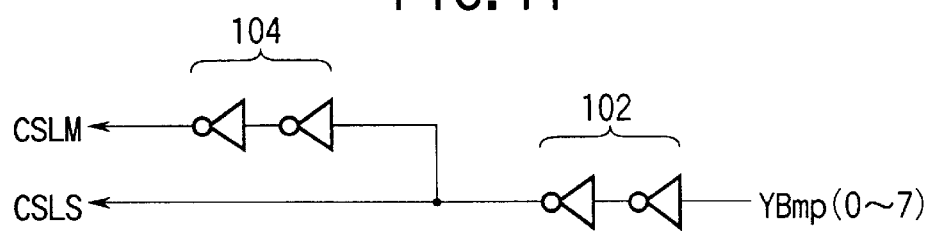
FIG. 12 is a circuit diagram of an example of the delay circuit of FIG. 10.

FIG. 12 shows the configuration of the buffer 102 and buffer 104. Each of the buffer 102 and delay circuit 104 is also composed of two inverter circuits.

With the fourth embodiment, the delay circuits 103, 104 delay the clock signal CLK and column addresses YBmp (0 to 7) to cause the input timing of the clock signal CLK and column addresses YBmp (0 to 7) supplied to the main column select sections 15a to 15e to coincide with that of the clock signal CLK and column addresses YBmp (0 to 7) supplied to the sub-column select sections 71a to 71e. As a result, when the fourth embodiment is applied to the second embodiment as shown in FIG. 10, the through current between the drivers of the main column select sections 15a to 15e and those of the sub-column select sections 71a to 71e is reduced further.

In the third embodiment of FIG. 9, the difference in timing between the main column select sections 15a to 15e and the sub-column select sections 71a to 71e has nothing to do with a through current. When the timing of activating the column lines is shifted, this shifts the timing of accessing the data lines DQ, /DQ, which makes control in a read and a write operation difficult. However, applying the fourth embodiment to the third embodiment enables the timing of accessing the data lines DQ, /DQ controlled by the main column select sections 15a to 15e to coincide with the timing of accessing the data lines DQ, /DQ controlled by the sub-column select sections 71a to 71e. As a result, this assures a reliable operation.

Figure 13:
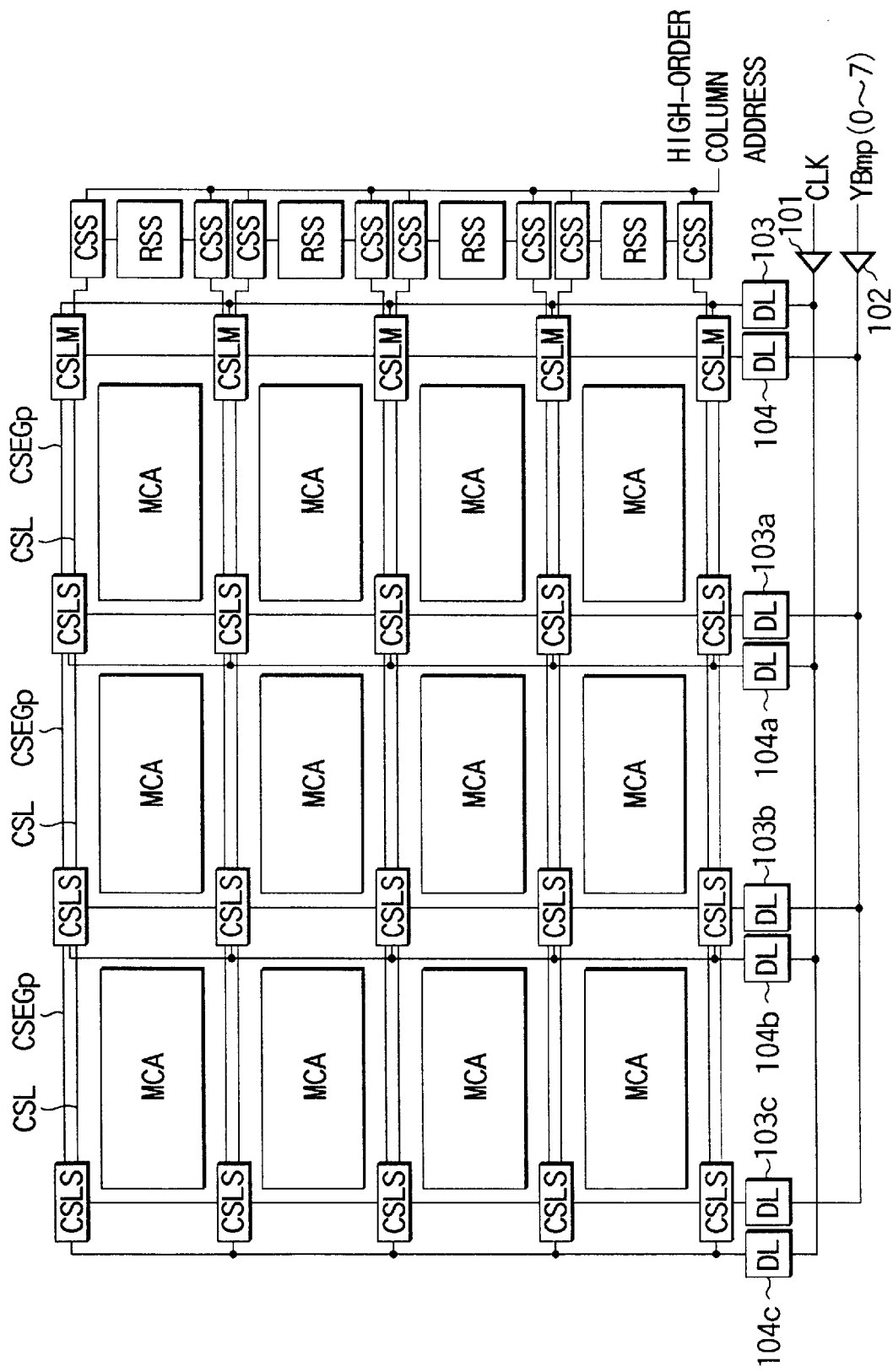
FIG. 13 is a schematic block diagram of the main part of a semiconductor memory device according to a fifth embodiment of the present invention.

FIG. 13 shows a fifth embodiment of the present invention. The fifth embodiment is such that the fourth embodiment is applied to a DRAM with memory cell arrays. To speed up the operation of the DRAM, it is necessary to speed up the activation and inactivation of the column select lines CSL. In the case of a DRAM in which a logic circuit has been incorporated, the number of inputs and outputs (I/O) is large and the number of gates connected to the column select lines CSL is also large. This contributes to a decrease in the operation speed of the column select lines CSL. To solve this problem, the number of inputs and outputs is kept constant, the column select lines are divided into groups of column select lines, and drivers for driving the groups are provided. When each of the drivers is provided with a column segment selector as in a conventional equivalent, the layout size increases seriously.

To avoid this shortcoming, the fifth embodiment has column segment selectors (CSS) and main column select sections (CSLM) provided only in one place and a sub-column select section (CSLS) provided for each memory cell array (MCA). Column select lines CSL and wires for transmitting the segment select signals CSEGp are provided between the main column select sections (CSLM) and the sub-column select sections (CSLS) and between sub-column select sections (CSLS). The column select lines CSL and the wires for transmitting the segment select signals CSEGp are provided on, for example, the sense amplifiers or the memory cell arrays.

The clock signal CLK and column addresses YBmp (0 to 7) are supplied to the main column select sections (CSLM) and sub-column select sections (CSLS) in each column via the delay circuits 103, 103a to 103c, 104, 104a to 104c. The delay circuits 103, 103a to 103c, 104, 104a to 104c have the delay times corresponding to the distances from the buffers 101, 102.

FIG. 14 shows part of the circuit of FIG. 13. In FIG. 14, the same parts as those in FIG. 13 are indicated by the same reference symbols.

FIG. 15 shows a circuit obtained by applying the fifth embodiment to the third embodiment. In FIG. 15, the same parts as those in FIGS. 13 and 9 are indicated by the same reference symbols.

With the fifth embodiment, column segment selectors (CSS) and main column select sections (CSLM) are provided only in one place and a sub-column select section (CSLS) is provided for each memory cell array (MCA). This prevents the layout size from increasing even in a memory with many inputs and outputs and improves the operating speed of the column select lines CSL.

Figure 16:
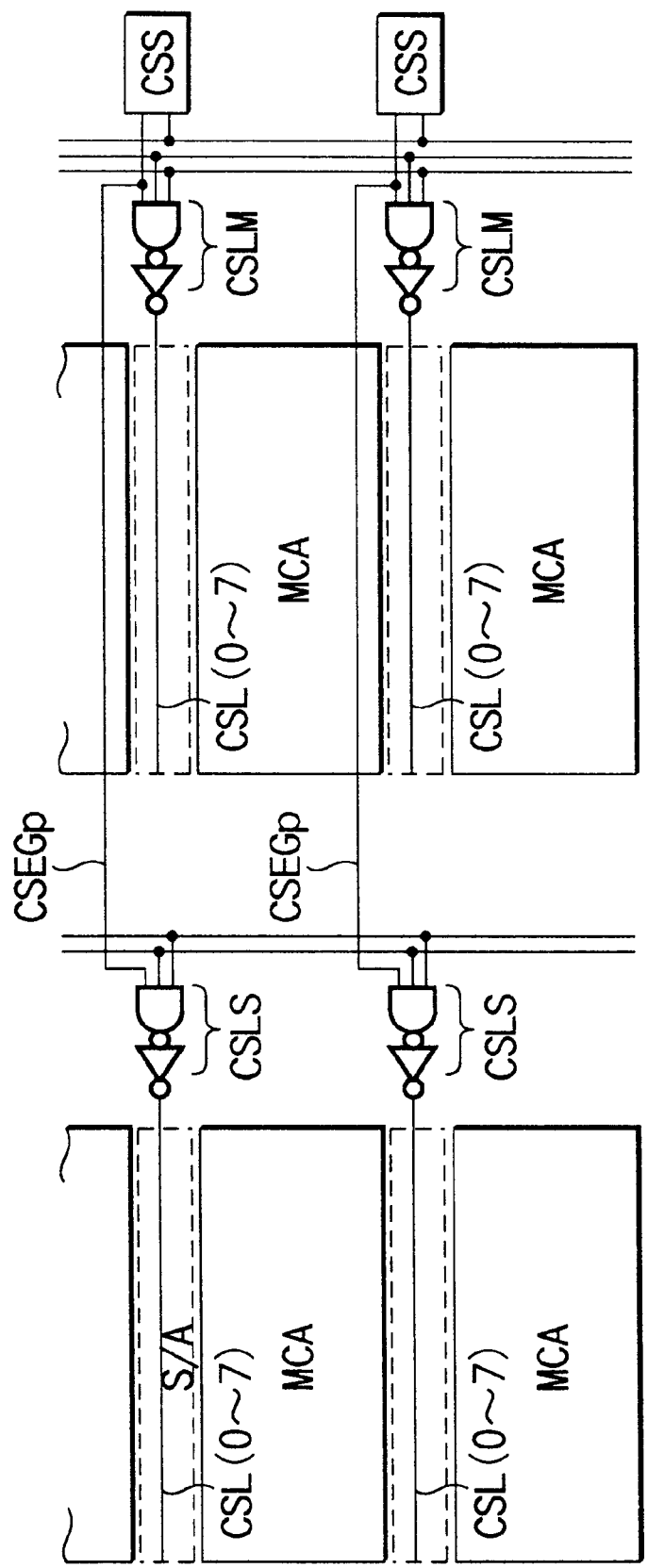
FIG. 16 is a circuit diagram of a modification of the fifth embodiment.

FIG. 16 shows a modification of the fifth embodiment. In the modification, the capacitance of the memory cell array is smaller than that in FIGS. 14 and 15. In this case, since the length of the column select line CSL is shorter than that in the first to fifth embodiments, the column select sections CSLM, CSLS provided at one end of the column select lines CSL can drive the column select lines. This configuration also suppresses the increase of the layout size and improves the operating speed of the column select lines CSL.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell array with memory cells arranged in the directions of row and column in matrix form;
column select gates for selecting columns in said memory cell array;
column select lines which are connected to said column select gates and transmit activating signals for activating column select gates;
column decoders which are connected to one end of said column select lines and produce said activating signals according to an address; and
driving circuits which are connected to the other end of said column select lines and which receive said activating signals supplied via said column select lines from said column decoders and drive said column select lines.

2. A semiconductor memory device according to claim 1, wherein said driving circuits comprise latch circuits.

3. A semiconductor memory device according to claim 2, wherein said latch circuits are each composed of two inverters.

4. A semiconductor memory device comprising:
memory cell arrays with memory cells arranged in the directions of row and column in matrix form;
column select gates which are provided near said memory cell arrays and select columns in said memory cell arrays;
column select lines which are connected to said column select gates and transmit activating signals for activating column select gates;
a select signal generator circuit which is provided on the side of one end of said column select lines and generates a select signal for selecting said memory cell array according to an address;
a first decoder which is connected to one end of said column select lines and generates said activating signals according to an address and said select signal supplied from said select signal generator circuit; and
a second decoder which is connected to the other end of said column select lines and, together with said first decoder, generates said activating signals according to said address and said select signal supplied from said select signal generator circuit.

5. A semiconductor memory device according to claim 4, further comprising wires which connect said select signal generator circuit to said second decoder and transmit said select signal and which are provided above said memory cell arrays.

6. A semiconductor memory device according to claim 5, further comprising sense amplifiers which are provided near said memory cell arrays and sense the signals read from said memory cells, with said wires provided above said sense amplifiers.

7. A semiconductor memory device according to claim 6, wherein said wires are divided in the middle in the direction of row.

8. A semiconductor memory device according to claim 4, further comprising:
a first and a second signal line which are connected to said first and second decoders, respectively, and supply clock signals to said first and second decoders; and
a delay circuit which is connected to at least said first signal line and which has a delay time corresponding to the delay time of the clock signal transmitted to said second signal line.

9. A semiconductor memory device comprising:
memory cell arrays with memory cells arranged in the directions of row and column in matrix form;
column select gates for selecting columns in each of said memory cell arrays;
first and second column select lines which are provided straight in the direction of row in each of said memory cell arrays and which are connected to said column select gates and transmit activating signals for activating the column select gates;
a select signal generator circuit which is provided near said first column select lines and generates a select signal for selecting a specific memory cell array according to an address;
a first decoder which is connected to said first column select lines and generates said activating signals according to an address and the select signal supplied from said select signal generator circuit; and
a second decoder which is connected to said second column select lines and, together with said first decoder, generates said activating signals according to said select signal supplied from said select signal generator circuit and address.

10. A semiconductor memory device according to claim 9, further comprising wires which connect said select signal generator circuit to said second decoder and transmit said select signal and which are provided above said memory cell arrays.

11. A semiconductor memory device according to claim 10, further comprising sense amplifiers which are provided near said memory cell arrays and sense the signals read from said memory cells, with said wires provided above said sense amplifiers.

12. A semiconductor memory device according to claim 9, further comprising:
a first and a second signal line which are connected to said first and second decoders, respectively, and supply clock signals to said first and second decoders; and
a delay circuit which is connected to at least said first signal line and which has a delay time corresponding to the delay time of the clock signal transmitted to said second signal line.

13. A semiconductor memory device comprising:
a first and a second memory cell array which each have memory cells arranged in the directions of row and column in matrix form and which are arranged in the direction of row;
column select gates which are provided in each of said first and second memory cell arrays and which select columns in each of said first and second memory cell arrays;
first column select lines which are provided in said first memory cell array and connected to said column select gates in said first memory cell array and which transmit activating signals for activating column select gates;
second column select lines which are provided in said second memory cell array and connected to said column select gates in said second memory cell array and which transmit activating signals for activating column select gates;
a select signal generator circuit which is provided near said first column select lines and generates a select signal for selecting one of said first and second memory cell arrays according to an address;

a first decoder which is connected to one end of said first column select line and which generates said activating signals according to an address and the select signal supplied from said select signal generator circuit; and second decoders which are connected to the other end of said first column select lines and both ends of said second column select lines and, together with said first decoder, which generate said activating signals according to an address and said select signal supplied from said select signal generator circuit.

14. A semiconductor memory device according to claim 13, further comprising wires which connect said select signal generator circuit to said second decoders and transmit said select signal and which are provided above said first and second memory cell arrays.

15. A semiconductor memory device according to claim 14, further comprising sense amplifiers which are provided near each of said first and memory cell arrays and sense the signals read from said memory cells, with said wires provided above said sense amplifiers.

16. A semiconductor memory device according to claim 13, wherein said first and second column select lines are divided in the middle in the direction of row.

17. A semiconductor memory device according to claim 13, further comprising:

a first signal line for supplying a clock signal to said first decoder;

second signal lines which are connected to said second decoders and supply clock signals to said second decoders; and delay circuits which are connected to said first signal line and said second signal lines and which each have delay times corresponding to the delay times of the clock signals transmitted to said second signal lines.

18. A semiconductor memory device comprising:

a first and a second memory cell array which each have memory cells arranged in the directions of row and column in matrix form and which are arranged in the direction of row;

column select gates which are provided in each of said first and second memory cell arrays and which select columns in each of said first and second memory cell arrays;

first column select lines which are provided in said first memory cell array and connected to said column select gates in said first memory cell array and which transmit activating signals for activating column select gates;

second column select lines which are provided in said second memory cell array and connected to said column select gates in said second memory cell array and which transmit activating signals for activating column select gates;

a select signal generator circuit which is provided near said first column select lines and generates a select signal for selecting one of said first and second memory cell arrays according to an address;

a first decoder which is connected to one end of said first column select lines and which generates said activating signals according to an address and the select signal supplied from said select signal generator circuit; and second decoders which are connected to one end of said second column select lines and, together with said first decoder, which generate said activating signals according to an address and said select signal supplied from said select signal generator circuit.

19. A semiconductor memory device according to claim 18, further comprising wires which connect said select signal generator circuit to said second decoders and transmit said select signal and which are provided above said first and second memory cell arrays.

20. A semiconductor memory device according to claim 19, further comprising sense amplifiers which are provided near each of said first and memory cell arrays and sense the signals read from said memory cells, with said wires provided above said sense amplifiers.

21. A semiconductor memory device according to claim 18, wherein said column select lines are divided in the middle in the direction of row.

22. A semiconductor memory device according to claim 18, further comprising:

a first signal line for supplying a clock signal to said first decoder;

second signal lines which are connected to said second decoders and supply clock signals to said second decoders; and delay circuits which are connected to said first signal line and said second signal lines and which each have delay times corresponding to the delay times of the clock signals transmitted to said second signal lines.

* * * * *